United States Patent
Yanagawa et al.

(10) Patent No.: US 8,643,413 B2
(45) Date of Patent: Feb. 4, 2014

(54) SEMICONDUCTOR DEVICE USING MULTI-PHASE CLOCK SIGNAL AND INFORMATION PROCESSING SYSTEM INCLUDING THE SAME

(76) Inventors: Yoshimitsu Yanagawa, Tokyo (JP); Tomonori Sekiguchi, Tokyo (JP); Akira Kotabe, Tokyo (JP); Takamasa Suzuki, Tokyo (JP)

(*) Notice: Subject to any disclaimer, the term of this patent is extended or adjusted under 35 U.S.C. 154(b) by 0 days.

(21) Appl. No.: 13/598,289

(22) Filed: Aug. 29, 2012

(65) Prior Publication Data

US 2013/0057326 A1    Mar. 7, 2013

(30) Foreign Application Priority Data

Sep. 6, 2011   (JP) ................................ 2011-193625

(51) Int. Cl.
    *H03L 7/00*         (2006.01)
(52) U.S. Cl.
    USPC ............................ 327/153; 327/231; 327/261
(58) Field of Classification Search
    USPC ......................................... 327/231, 261, 153
    See application file for complete search history.

(56) References Cited

U.S. PATENT DOCUMENTS

| 8,154,931 B2* | 4/2012 | Johnson .................... 365/189.02 |
| 8,284,617 B2* | 10/2012 | Johnson .................... 365/189.02 |
| 8,487,683 B1* | 7/2013 | Krishna et al. ................ 327/239 |
| 2004/0184308 A1* | 9/2004 | Kim et al. ...................... 365/154 |
| 2006/0038596 A1* | 2/2006 | Wang ............................. 327/158 |
| 2009/0213663 A1* | 8/2009 | Johnson .................... 365/189.02 |
| 2010/0315885 A1* | 12/2010 | Johnson .................... 365/189.02 |
| 2012/0188829 A1* | 7/2012 | Johnson .................... 365/189.05 |
| 2013/0016571 A1* | 1/2013 | Johnson .................... 365/189.02 |
| 2013/0187696 A1* | 7/2013 | Krishna et al. ................ 327/259 |

FOREIGN PATENT DOCUMENTS

JP    2010-16545 A    1/2010

* cited by examiner

*Primary Examiner* — Adam Houston
(74) *Attorney, Agent, or Firm* — Foley & Lardner LLP

(57) ABSTRACT

Disclosed herein is a device that includes a delay line that includes n delay circuits cascade-connected and delays an input clock signal by k cycles, and a routing circuit that generates multi-phase clock signals having different phases based on at least a part of n output clock signals output from the n delay circuits, respectively. The n and the k are both integers more than 1 and a greatest common divisor thereof is 1.

18 Claims, 11 Drawing Sheets

SEMICONDUCTOR DEVICE USING MULTI-PHASE CLOCK SIGNAL AND INFORMATION PROCESSING SYSTEM INCLUDING THE SAME

CROSS-REFERENCE TO RELATED APPLICATIONS

This application claims priority to Japanese patent application no. 2011-193628, filed Sep. 6, 2011, the entire contents of which is incorporated herein by reference.

BACKGROUND OF THE INVENTION

1. Field of the Invention

The present invention relates to a semiconductor device and an information processing system including the semiconductor device, and more particularly relates to a semiconductor device that uses a multi-phase clock signal with different phases and an information processing system including the semiconductor device.

2. Description of Related Art

Many semiconductor devices operate synchronously with a clock signal and some of the semiconductor devices use a multi-phase clock signal with different phases. Because the multi-phase clock signal has a phase interval shorter than a cycle of a base clock signal, how the multi-phase clock signal is generated becomes a problem.

As an example of a circuit that generates a multi-phase clock signal with a shorter phase interval, Japanese Patent Application Laid-open No. 2010-16545 discloses a circuit in which plural kinds of delay elements having different delay amounts are cascade-connected. With the multi-phase-clock generating circuit described in Japanese Patent Application Laid-open No. 2010-16545, the phase interval of the multi-phase clock signal can be shorter than a minimum delay time corresponding to one stage of delay elements.

However, the multi-phase-clock generating circuit described in Japanese Patent Application Laid-open No. 2010-16545 needs a number of delay elements to generate one of signals constituting the multi-phase clock signal. Accordingly, it is necessary to use so many delay elements in the whole circuit, which greatly increases the circuit scale.

The amount of data to be handled by a semiconductor device increases year by year and a processing speed thereof tends to be accelerated. Therefore, it is required that an information processing system that processes such a large amount of data at a high speed and reduces a required circuit scale, and a semiconductor device included in the system.

SUMMARY

In one embodiment, there is provided a semiconductor device that includes: $1^{st}$ to $n^{th}$ delay circuits cascade-connected in this order, the $1^{st}$ to $n^{th}$ delay circuits outputting $1^{st}$ to $n^{th}$ output clock signals, respectively, based on an input clock signal supplied to the $1^{st}$ delay circuit; a control circuit controlling a delay amount of each of the $1^{st}$ to $n^{th}$ delay circuits such that the $1^{st}$ to $n^{th}$ output clock signals have different phases from one another; and a data processing circuit processing a plurality of data signals synchronously with $1^{st}$ to $n^{th}$ output clock signals, respectively.

In another embodiment, there is provided an information processing system that includes first and second semiconductor devices and a data line that connects the first semiconductor device and the second semiconductor device with each other. Each of the first and second semiconductor devices including: $1^{st}$ to $n^{th}$ delay circuits cascade-connected in this order, the $1^{st}$ to $n^{th}$ delay circuits outputting $1^{st}$ to $n^{th}$ output clock signals, respectively, based on an input clock signal supplied to the $1^{st}$ delay circuit; a control circuit controlling a delay amount of each of the $1^{st}$ to $n^{th}$ delay circuits such that the $1^{st}$ to $n^{th}$ output clock signals have different phases from one another; and a data processing circuit processing a plurality of data signals synchronously with $1^{st}$ to $n^{th}$ output clock signals, respectively. The data processing circuit included in the first semiconductor device converts the data signals from parallel to serial and outputs the data signals to the data line in serial. The data processing circuit included in the second semiconductor device converts the data signals supplied from the first semiconductor device via the data line from serial to parallel.

In still another embodiment, there is provided a semiconductor device that includes: a clock generating circuit including a plurality of delay circuits which are connected such that an output node of a preceding one of the delay circuits is connected to an input node of a succeeding one of the delay circuits and an input node of a leading one of the delay circuits being configured to receive an internal clock signal, the delay circuits being configured to respectively output delayed clock signals to the output nodes thereof, and the delayed clock signals outputted from the delay circuits being different in phase from one another; and a data input/output circuit including a plurality of input nodes each supplied with corresponding data, an output node, and a plurality of switching circuits each provided between the output node and a corresponding one of the input nodes, each of the switching circuits being configured to transfer the corresponding data to the output node in response to a corresponding one of the delayed clock signals.

In still another embodiment, there is provided semiconductor device that includes: a delay line that includes n delay circuits cascade-connected and delays an input clock signal by k cycles; and a routing circuit that generates multi-phase clock signals having different phases based on at least a part of n output clock signals output from the n delay circuits, respectively. The n and the k are both integers more than 1 and a greatest common divisor thereof is 1.

DETAILED DESCRIPTION OF THE EMBODIMENTS

Preferred embodiments of the present invention will now be explained below in detail with reference to the accompanying drawings.

Figure 1:
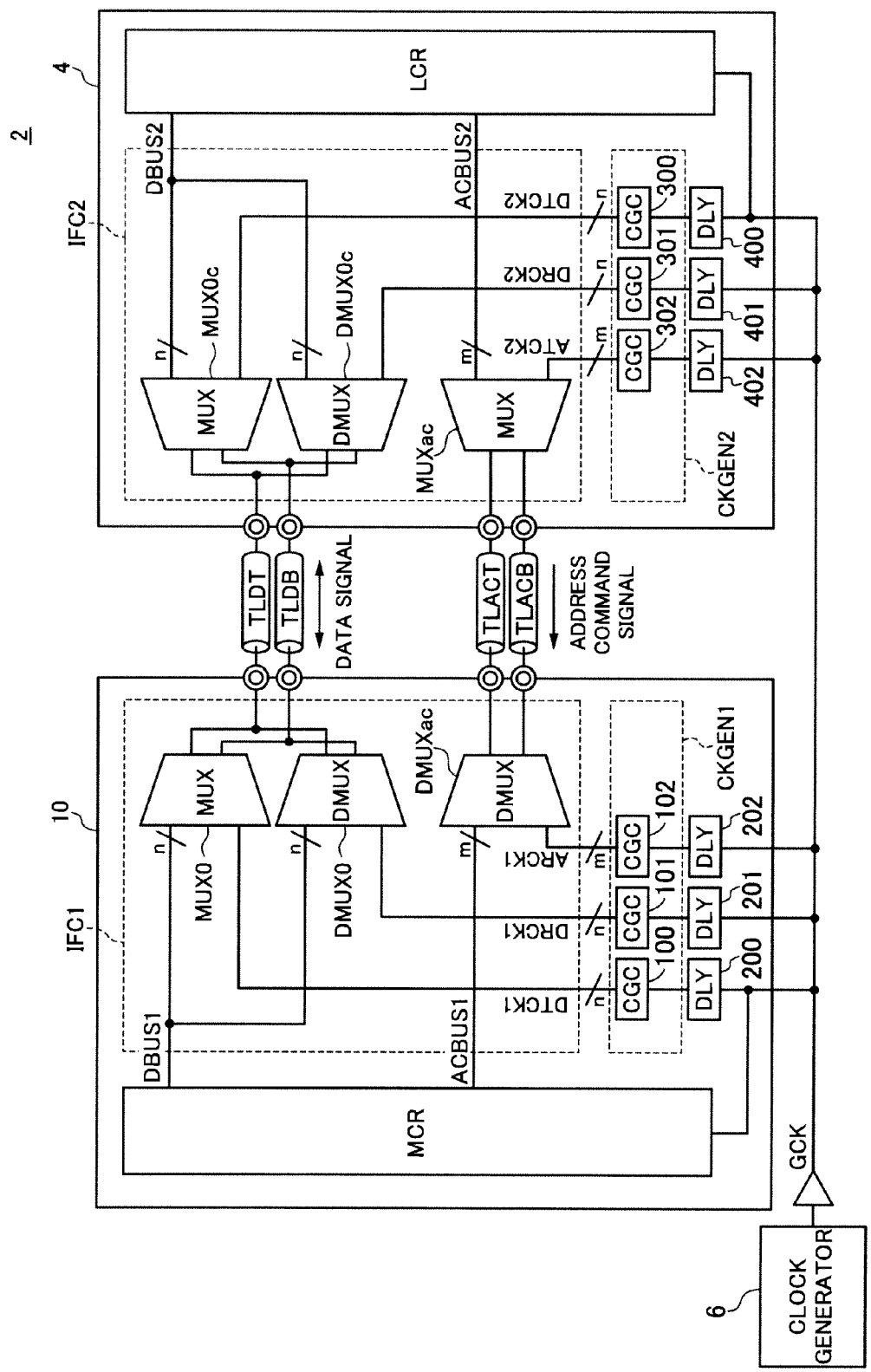
FIG. 1 is a block diagram showing a configuration of an information processing system according to an embodiment of the present invention.

Referring now to FIG. 1, the information processing system 2 includes a semiconductor device 4 and a semiconductor device 10 connected via data lines TLDT and TLDB and address command lines TLACT and TLACB. Although not particularly limited thereto, the semiconductor device 10 is a memory device such as a DRAM (Dynamic Random Access Memory) and the semiconductor device 4 is a controller device that controls the memory device. A global clock signal GCK is supplied commonly to the semiconductor devices 4 and 10 from a clock generator 6. The global clock signal GCK is used as a reference clock signal for the information processing system 2 according to the present embodiment.

As shown in FIG. 1, the semiconductor device 10 that constitutes a DRAM includes a main circuit unit MCR, an interface circuit unit IFC1, and a clock generating unit CKGEN1. The main circuit unit MCR is a backend circuit included in the DRAM, such as a memory cell array and a decoder. Similarly, the semiconductor device 4 that constitutes a controller device includes a main circuit unit LCR, an interface circuit unit IFC2, and a clock generating unit CKGEN2. The main circuit unit LCR is a backend circuit included in the controller device, such as a logic circuit.

The interface circuit unit IFC1 included in the semiconductor device 10 and the interface circuit unit IFC2 included in the semiconductor device 4 have similar circuit configurations. Specifically, the interface circuit unit IFC1 of the semiconductor device 10 includes a multiplexer MUX0 and a demultiplexer DMUX0 for data and a demultiplexer DMUXac for addresses and commands. The interface circuit unit IFC2 of the semiconductor device 4 includes a multiplexer MUX0c and a demultiplexer DMUX0c for data and a multiplexer MUXac for addresses and commands. The multiplexer and the demultiplexer may be referred to also as "data processing circuit".

The multiplexer MUX0 for data converts a data signal of n bits supplied in parallel from the main circuit unit MCR via a data bus DBUS1 into a serial data signal. The converted serial, data signal is supplied to the semiconductor device 1 via a pair of the data lines TLDT and TLDB. The serial data signal supplied to the semiconductor device 4 is converted into a parallel signal by the demultiplexer DMUX0c for data. The converted parallel data signal is supplied to the main circuit unit LCR via a data bus DBUS2.

Similarly, the multiplexer MUX0c for data converts a data signal of n bits supplied in parallel from the main circuit unit LCR via the data bus DBUS2 into a serial data signal. The converted serial data signal is supplied to the semiconductor device 10 via the pair of the data lines TLDT and TLDB. The serial data signal supplied to the semiconductor device 10 is converted into a parallel signal by the demultiplexer DMUX0 for data. The converted parallel data signal is supplied to the main circuit unit MCR via the data bus DBUS1.

On the other hand, the multiplexer MUXac for addresses and commands converts an address command signal of m bits supplied in parallel from the main circuit unit LCR via an address command bus ACBUS2 into a serial signal. The address command signal converted in serial is supplied to the semiconductor device 10 via a pair of the address command lines TLACT and TLACB. The address command signal supplied to the semiconductor device 10 in serial is converted into a parallel signal by the demultiplexer DMUXac for addresses and commands. The address command signal in parallel is supplied to the main circuit unit MCR via an address command bus ACBUS1.

As described above, in the information processing system 2 according to the present embodiment, a data signal of n bits transmitted and received between the semiconductor device 4 and the semiconductor device 10 is converted into a serial signal on a transmission side and serially transferred via the data lines TLDT and TLDB. The serially-transferred data signal is converted into a parallel signal on a reception side. Similarly, an address command signal of m bits supplied from the semiconductor device 4 to the semiconductor device 10 is converted into a serial signal in the semiconductor device 4 on a transmission side and serially transferred via the address command lines TLACT and TLACB. The address command signal that is serially transferred is converted into a parallel signal in the semiconductor device 10 on a reception side. The reason why the serial transfer is performed is that, if a signal of plural bits (a data signal of n bits or an address command signal of m bits in the present example) is transferred in parallel at a high speed, synchronization among the bits is difficult on the transmission side and the reception side.

While the data signal and the address command signal are both transferred by a differential method using a pair of signal lines in the example shown in FIG. 1, the present invention is not limited thereto. Therefore, transfer can be performed by a single-ended method using one signal line for one bit. However, it is preferable to adopt the differential method in high-speed signal transfer.

While the example of FIG. 1 shows the circuit configuration that transfers both of the data signal and the address command signal one bit at a time, the present invention is not limited thereto. Therefore, plural bits can be transferred at a time by using plural pairs of data lines, for example.

The multiplexer MUX0, the demultiplexer DMUX0, and the demultiplexer DMUXac included in the interface circuit unit IFC1 are controlled by multi-phase clock signals DTCK1, DRCK1, and ARCK1 output from clock generating circuits 100, 101, and 102 included in the clock generating circuit CKGEN1, respectively. The clock generating circuits 100, 101, and 102 may be a DLL (Delay Locked Loop) circuit. The clock generating circuits 100, 101, and 102 receive the global clock signal GCK timing-adjusted by delay circuits 200, 201, and 202 and generate the multi-phase clock signals DTCK1, DRCK1, and ARCK1 based on the timing-adjusted global clock signal GCK, respectively. In the present example, the multi-phase clock signals DTCK1 and DRCK1 generated by the clock generating circuits 100 and 101 are multi-phase clock signals with n phases and the multi-phase clock signal ARCK1 generated by the clock generating circuit 102 is a multi-phase clock signal with m phases. The n-phase multi-phase clock signal is composed of n clock signals $\phi1$ to $\phi n$ having different phases and each cycle of the clock signals $\phi1$ to $\phi n$ is equal to that of the global clock signal GCK. The m-phase multi-phase clock signal is composed of m clock signals φ1 to φm having different phases and each cycle of the clock signals φ1 to φm is equal to that of the global clock signal GCK.

Similarly, the multiplexer MUX0c, the demultiplexer DMUX0c, and the multiplexer MUXac included in the interface circuit unit IFC2 are controlled by multi-phase clock signals DTCK2, DRCK2, and ARCK2 output from clock generating circuits 300, 301, and 302 included in the clock generating unit CKGEN2, respectively. The clock generating circuits 300, 301, and 302 may be a DLL circuit. The clock generating circuits 300, 301, and 302 receive the global clock signal GCK timing-adjusted by delay circuits 400, 401, and 402 and generate the multi-phase clock signals DTCK2, DRCK2, and ARCK2 based on the timing-adjusted global clock signal GCK, respectively. In the present example, the multi-phase clock signals DTCK2 and DRCK2 generated by the clock generating circuits 300 and 301 are multi-phase clock signals with n phases and the multi-phase clock signal ARCK2 generated by the clock generating circuit 302 is a multi-phase clock signal with m phases.

Figure 2:
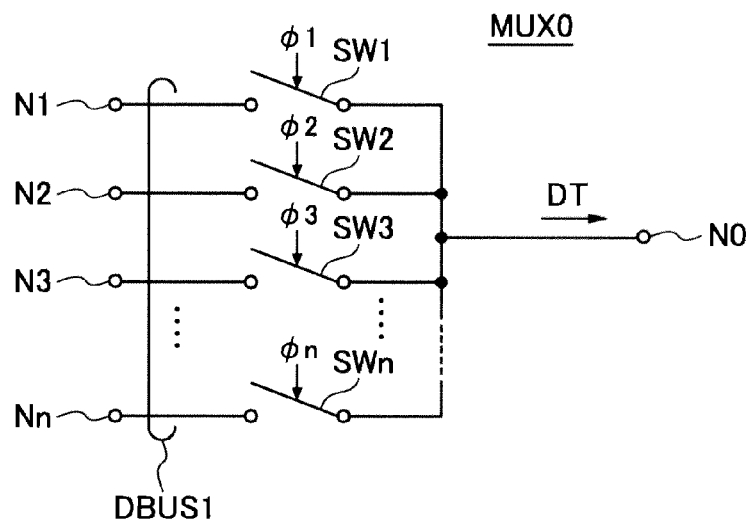
FIG. 2 is a circuit diagram showing a part of the multiplexer MUX0 shown in FIG. 1.

FIG. 2 shows a circuit part that converts a parallel n-bit data signal supplied via the data bus DBUS1 into a serial non-inverted signal DT (a true signal). While a circuit part that converts the n-bit data signal into a serial inverted signal (a bar signal) is also included the multiplexer MUX0, this circuit part is not shown.

The circuit part shown in FIG. 2 has a configuration in which n input nodes N1 to Nn and one output node N0 are included and n switches SW1 to SWn are inserted between the corresponding input nodes N1 to Nn and the output node N0, respectively. The switches SW1 to SWn are controlled by the clock signals φ1 to φn of n phases that constitute the multi-phase clock signal DTCK1, respectively. The input nodes N1 to Nn are connected to plural lines constituting the data bus DBUS1, respectively. The output node N0 is connected to the data line TLDT.

Figure 3:
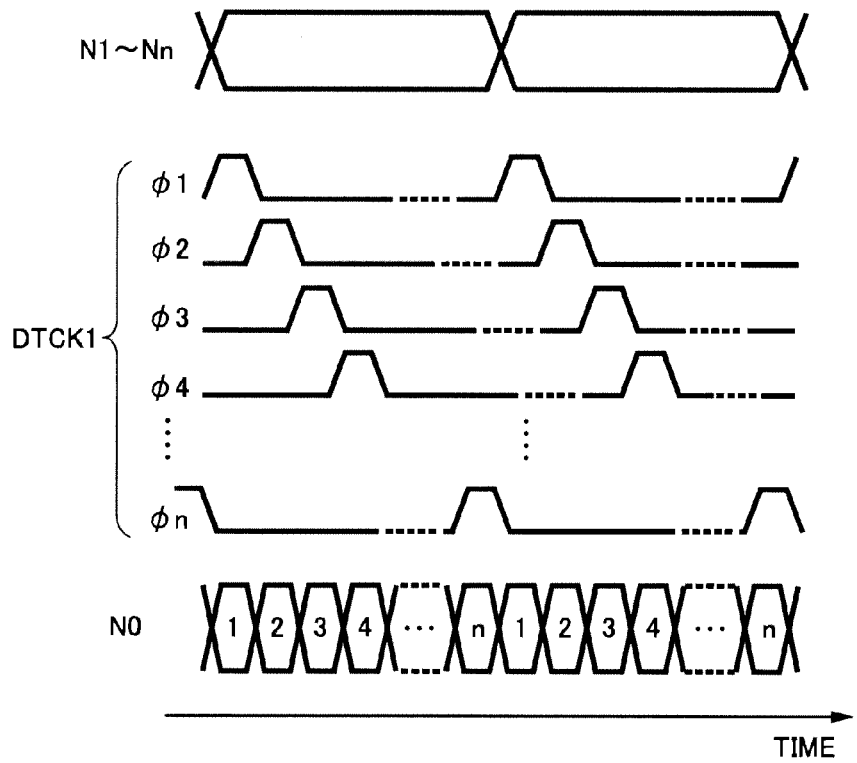
FIG. 3 is a timing chart for explaining an operation of the multiplexer MUX0 shown in FIG. 2.

Turning to FIG. 3, the clock signals φ1 to φn of n phases that constitute the multi-phase clock signal DTCK1 have phases that are shifted from each other and waveforms in which high-level periods do not overlap with each other. The cycles of the clock signals φ1 to φn are all equal to that of the global clock signal GCK. Accordingly, a data signal supplied in parallel to the input nodes N1 to Nn in FIG. 2 is sequentially output to the output node N0 synchronously with the clock signals φ1 to φn of n phases, respectively. As a result, the parallel n-bit data signal is converted into a serial signal during each cycle of the global clock signal GCK.

A circuit configuration of the demultiplexer DMUX0 is the same as that shown in FIG. 2 except that an input side and an output side are inverted. Therefore, the demultiplexer DMUX0 has one input node N0 and n output nodes N1 to Nn, and n switches SW1 to SWn are inserted between the input node N0 and the corresponding output nodes N1 to Nn, respectively. Accordingly, a data signal serially supplied to the input node N0 is sequentially transmitted to the output nodes N1 to Nn synchronously with the clock signals φ1 to φn of n phases, respectively. As a result, the serial n-bit data signal is converted into a parallel signal during each cycle of the global clock signal GCK.

A read operation performed by the information processing system 2 according to the present embodiment will be explained next.

Figure 4:
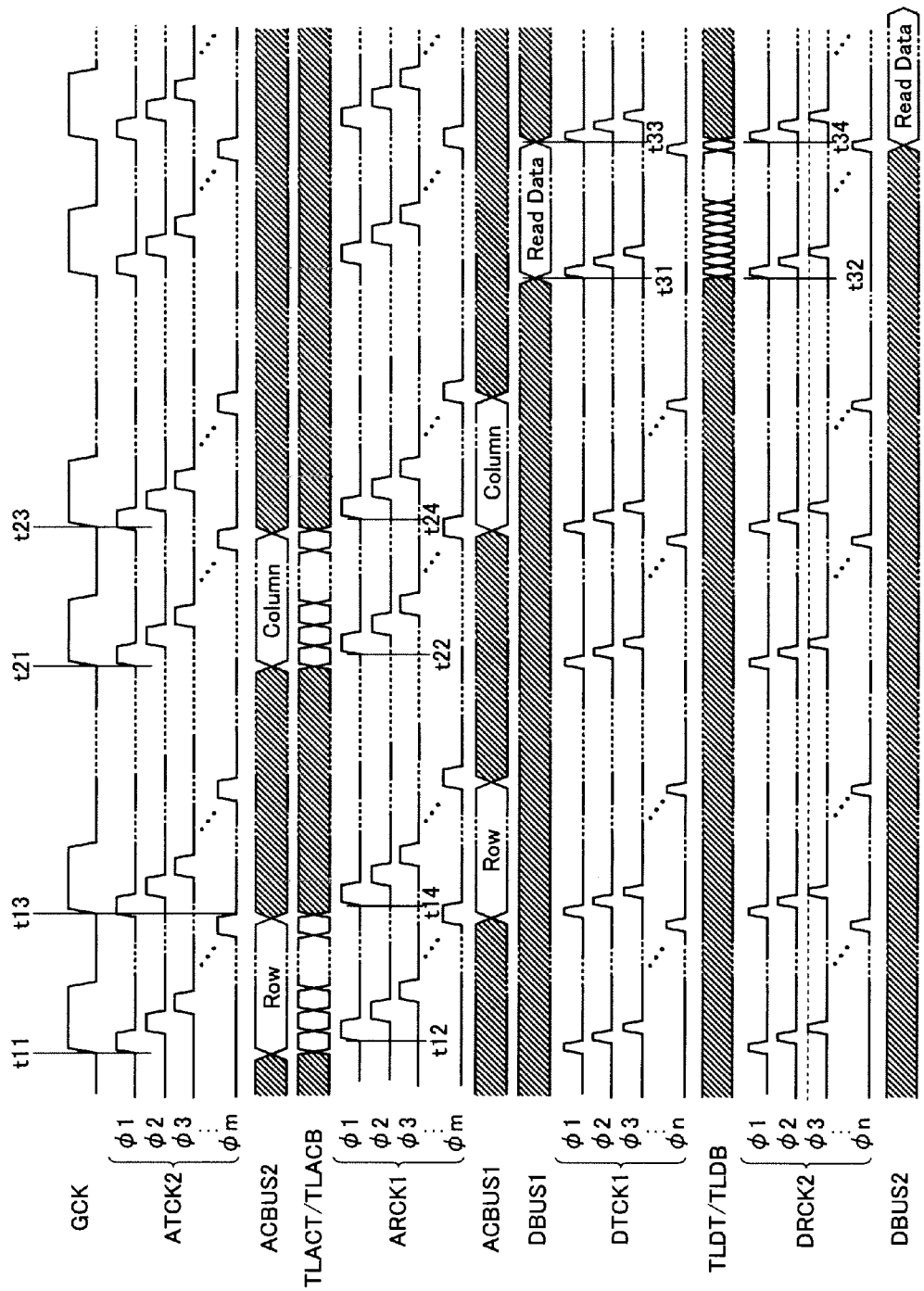
FIG. 4 is a timing chart for explaining a read operation performed by the information processing system shown in FIG. 1.

The read operation is an operation in which a read command is issued from the semiconductor device 4 as the controller device to the semiconductor device 10 as a DRAM and read data are supplied in response thereto from the semiconductor device 10 as the DRAM to the semiconductor device 4 as the controller device. In an example shown in FIG. 4, an address command signal in parallel on the address command bus ACBUS2 is converted into a serial signal by the multiplexer MUXac during a period of times from t11 to t13. This address command signal includes at least an active command and a row address, and is denoted by "Row" in FIG. 4. The address command signal Row in serial is transferred from the semiconductor device 4 to the semiconductor device 10 via the address command lines TLACT and TLACB.

On the side of the semiconductor device 10, the address command signal Row transferred via the address command lines TLACT and TLACB in serial is converted into a parallel signal by the demultiplexer DMUXac during a period of times from t12 to t14. The times t12 and t14 are slightly delay from the times t11 and t13, respectively, in consideration of a transfer time via the address command lines TLACT and TLACB. These delays are adjusted by the delay circuits 202 and 402. The address command signal ROW regenerated in this way in parallel is supplied to the main circuit unit MCR via the address command bus ACBUS1. The main circuit unit MCR performs a row access to the memory cell array (not shown) in response thereto.

After a predetermined time has passed from the time t13, an address command signal in parallel on the address command bus ACBUS2 is converted into a serial signal by the multiplexer MUXac during a period of times t21 to t23. This address command signal includes at least a read command and a column address, and is denoted by "Column" in FIG. 4. The address command signal Column in serial is transferred from the semiconductor device 4 to the semiconductor device 10 via the address command lines TLACT and TLACB.

On the side of the semiconductor device 10, the address command signal Column transferred via the address command lines TLACT and TLACB in serial is converted into a parallel signal by the demultiplexer DMUXac during a period of times t22 to t24. The times t22 and t24 are slightly delayed from the times t21 and t23, respectively, and these delays are adjusted by the delay circuits 202 and 402. The address command signal Column regenerated in this way in parallel is supplied to the main circuit unit MCR via the address command bus ACBUS1. The main circuit unit MCR performs a column access to the memory cell array (not shown) in response thereto.

When the row access and the column access to the memory cell array are performed in this order, n-bit read data that are read from memory cells specified by the corresponding row and column addresses are output from the main circuit unit MCR. The n-bit read data output from the main circuit unit MCR are supplied in parallel to the multiplexer MUX0 via the data bus DBUS1. The read data are denoted by "ReadData" in FIG. 4.

After a predetermined time has passed from the time t24, the read data ReadData in parallel on the data bus DBUS1 are converted into serial data by the multiplexer MUX0 during a period of times from t31 to t33. The read data ReadData in serial are transferred from the semiconductor device 10 to the semiconductor device 4 via the data lines TLDT and TLDB.

On the side of the semiconductor device 4, the read data ReadData transferred via the data lines TLDT and TLDB in serial converted into parallel data by the demultiplexer DMUX0c during a period of times t32 to t34. The times t32 and t34 are slightly delayed from the times t31 and t33, respectively, and these delays are adjusted by the delay circuits 200 and 401. The read data ReadData regenerated in this way in parallel are supplied to the main circuit unit LCR via the data bus DBUS2. This completes a sequence of read operations.

A write operation is fundamentally the same as the read operation mentioned above except that a data signal is transferred from the semiconductor device 4 to the semiconductor device 10. In this case, timings when the semiconductor device 10 starts reception of write data and finishes the reception are slightly delayed from timings when the semiconductor device 4 starts transmission of the write data and finishes the transmission, respectively. These delays are adjusted by the delay circuits 201 and 400.

Figure 5:
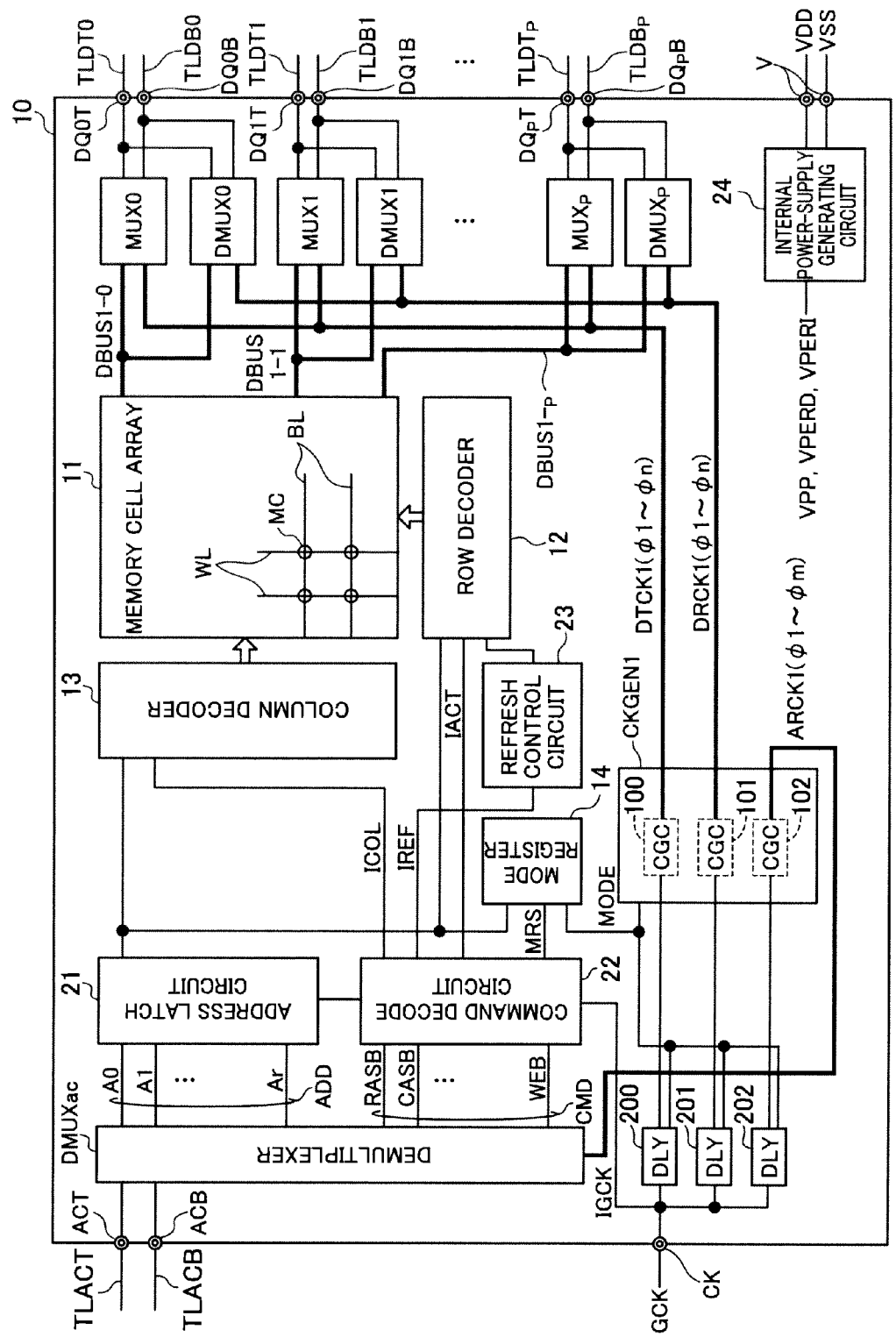
FIG. 5 is a block diagram showing an overall configuration of the semiconductor device 10 shown in FIG. 1.

Turning to FIG. 5, the semiconductor device 10 is a DRAM, for example, as mentioned above and has a memory cell array 11. The memory cell array 11 has a plurality of word lines WL, a plurality of bit lines BL, and a memory cell MC located at each intersection therebetween. Selection of a word line WL is performed by a row decoder 12 and selection of a bit line BL is performed by a column decoder 13.

As shown in FIG. 5, address command terminals ACT and ACB, a clock terminal CK, data terminals DQ (DQ0T/B to DQpT/B), and a power-supply terminal V are provided as external terminals in the semiconductor device 10.

The address command terminals ACT and ACB are connected to the address command lines TLACT and TLACB, respectively, and an address command signal is supplied thereto from the semiconductor device 4. An address command signal supplied to the address command terminals ACT and ACB in serial is converted by the demultiplexer DMUXac into an address signal ADD in parallel and a command signal CMD in parallel. In an example shown in FIG. 5, the address signal ADD is composed of r+1 bits of address signals A0 to Ar. The command signal CMD is a combination of signals including a row-address strobe signal RASB, a column-address strobe signal CASB, a write enable signal WEB, and the like.

The address signal ADD is latched by an address latch circuit 21. The address signals A0 to Ar latched by the address latch circuit 21 are supplied to the row decoder 12, the column decoder 13, or a mode register 14. The mode register 14 is a circuit in which a parameter indicating an operation mode of the semiconductor device 10 is set.

The command signal CMD is supplied to a command decode circuit 22. The command decode circuit 22 decodes the command signal CMD to generate various types of internal commands. The internal commands include an active signal IACT, a column signal ICOL, a refresh signal IREF, a mode-register set signal MRS, and the like.

The active signal TACT is activated when the command signal CMD indicates a row access, i.e., an active command is issued. When the active signal IACT is activated, the address signal ADD latched by the address latch circuit 21 is supplied to the row decoder 12. This causes word lines WL specified by the corresponding address signal ADD to be selected.

The column signal ICOL is activated when the command signal CMD indicates a column access, i.e., a read command or a write command is issued. When the column signal ICOL is activated, the address signal ADD latched by the address latch circuit 21 is supplied to the column decoder 13. This causes bit lines BL specified by the corresponding address signal ADD to be selected.

Accordingly, when an active command and a read command are issued in this order and row addresses and column addresses are supplied synchronously therewith, read data are read from memory cells MC specified by the row addresses and the column addresses. The read data are supplied to multiplexers MUX0 to MUXp via data buses DBUS1-0 to DBUS1-p, respectively. The multiplexers MUX0 to MUXp convert the parallel read data into serial data synchronously with the multi-phase clock signal DTCK1 and output the serial data to corresponding data terminal pairs DQ0T/B to DQpT/B, respectively. The data terminal pairs DQ0T/B to DQpT/B are connected to corresponding data lines (TLDT0, TLDB0, TLDT1, TLDB1, . . . ), respectively.

On the other hand, when an active command and a write command are issued in this order, row addresses and column addresses are supplied synchronously therewith and then write data are serially input to the data terminal pairs DQ0T/B to DQpT/B, the serial write data are converted into parallel data by the demultiplexers DMUX0 to DMUXp synchronously with the multi-phase clock signal DRCK1, respectively. The parallel write data are supplied to the memory cell array 11 via the data buses DBUS1-0 to DBUS1-p and written in memory cells MC specified by the row addresses and the column addresses.

The refresh signal IREF is activated when the command signal CMD indicates a refresh command. When the refresh signal IREF is activated, a refresh control circuit 23 performs a row access to select a predetermined word line WL. This causes a plurality of memory cells MC connected to the selected word line WL to be refreshed. Selection of the word line WL is performed by a refresh counter (not shown) included in the refresh control circuit 23.

The mode-register set signal MRS is activated when the command signal CMD indicates a mode-register set command. Accordingly, when a mode-register set command is issued and a mode signal is supplied synchronously therewith through the address command terminals ACT and ACB, a set value of the mode register 14 can be changed.

The clock terminal CK is a terminal to which the global clock signal GCK is supplied. The global clock signal GCK supplied into the semiconductor device 10 is used as a basic clock signal inside of the semiconductor device 10 and is referred to as an internal global clock signal IGCK in the present specification. The internal global clock signal IGCK is supplied to the command decode circuit 22 and also supplied to the delay circuits 200 to 202. The delay circuits 200 to 202 finely adjust a timing of the internal global clock signal IGCK, and outputs thereof are supplied to the clock generating circuits 100 to 102, respectively.

The clock generating circuits 100 to 102 generates the multi-phase clock signals DTCK1, DRCK1, and ARCK1 based on the internal global clock signal IGCK timing-adjusted, respectively. The multi-phase clock. signal DTCK1 is supplied to the multiplexers MUX0 to MUXp and is used as a synchronization signal for specifying the timing to convert parallel read data into serial data. The multi-phase clock signal DRCK1 is supplied to the demultiplexers DMUX0 to DMUXp and is used as a synchronization signal for specifying the timing to convert serial write data into parallel data. The multi-phase clock signal ARCK1 is supplied to the demultiplexer DMUXac and is used as a synchronization signal for specifying the timing to convert a serial address command signal into a parallel signal.

The power-supply terminals V are terminals to which power-supply potentials VDD and VSS are supplied. The power-supply potentials VDD and VSS supplied to the power-supply terminals V are supplied to an internal power-supply generating circuit 24. The internal power-supply generating circuit 24 generates various internal potentials VPP, VPERD, VPERI, and the like based on the power-supply potentials VDD and VSS. The internal potential VPP is mainly used by the row decoder 12, the internal potential VPERD is mainly used by the clock generating circuits 100 to 102, and the internal potential VPERI is used by many other circuit blocks.

Figure 6:
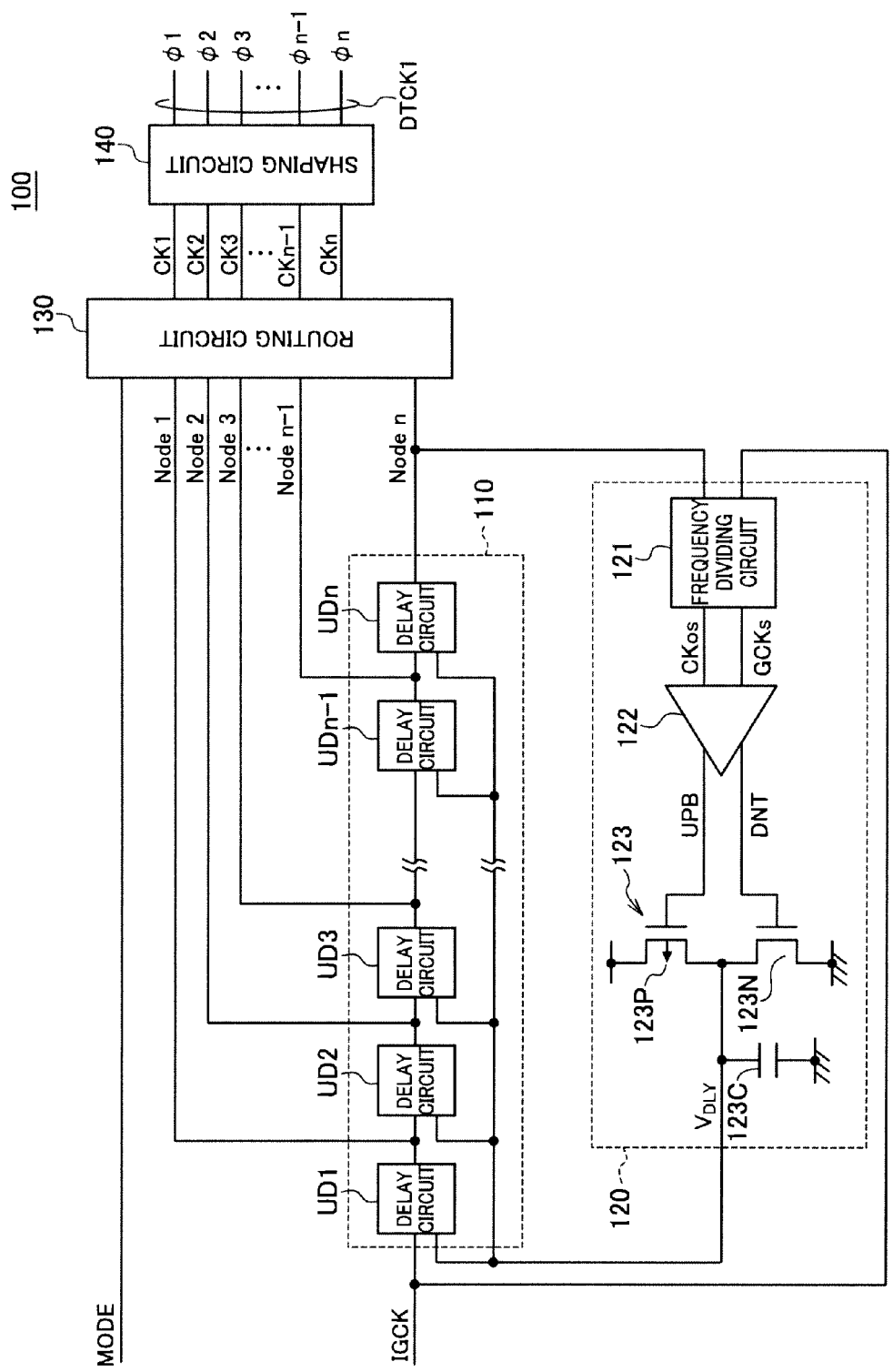
FIG. 6 is a circuit diagram of the clock generating circuit 100 shown in FIG. 5.

Turning to FIG. 6, the clock generating circuit 100 includes a delay line 110, a control circuit 120 that controls a delay amount of the delay line 110, a routing circuit 130 that rearranges output clock signals Node1 to Noden output from the delay line 110, and a shaping circuit 140 that shapes waveforms of multi-phase clock signals CK1 to CKn output from the routing circuit 130 to generate the multi-phase clock signal DTCK1. The shaping circuit 140 configured to change a duty ratio of each of delayed clock signals respectively outputted from the delay circuits such that ones of high and low time periods of the delayed clock signal are not substantially overlapped with one another.

The delay line 110 includes n delay circuits UD1 to UDn that are cascade-connected. The internal global clock signal IGCK that is timing-adjusted by the delay circuit 200 is supplied to the delay circuit UD1 at the first stage. The internal global clock signal IGCK supplied to the delay circuit UD1 may be referred to also as "input clock signal". Because the n delay circuits UD1 to UDn are cascade-connected, the output clock signals Node1 to Noden output from the delay circuits UD1 to UDn have phases delayed in this order. While all of the output clock signals Node1 to Noden are supplied to the routing circuit 130 in the present example, only some of the output clock signals Node1 to Noden can be supplied to the routing circuit 130.

The output clock signal Noden output from the delay circuit UDn at the last stage has a phase delayed exactly by k cycles from the internal global clock signal IGCK supplied to the delay circuit UD1 at the first stage. Such a control is performed by the control circuit 120. As shown in FIG. 6, the control circuit 120 includes a frequency dividing circuit 121, a phase determining circuit 122, and a control-voltage generating circuit 123.

The frequency dividing circuit 121 divides frequencies of the output clock signal Noden and the internal global clock signal IGCK by k. A divided clock signal GCKs output from the frequency dividing circuit 121 is obtained by frequency-dividing the internal global clock signal IGCK by k, and a divided clock signal CKos output from the frequency dividing circuit 121 is obtained by frequency-dividing the output clock signal Noden by k. These divided clock signals GCKs and CKos are supplied to the phase determining circuit 122 to determine phases thereof. When a determination result indicates that the phase of the divided clock signal CKos is delayed from that of the divided clock signal GCKs (that is, the delay amount of the delay line 110 is too large), the phase determining circuit 122 activates an up signal UPB to a low level. At that time, a down signal DNT is inactivated to a low level. This turns on a P-channel MOS transistor 123P included in the control-voltage generating circuit 123, which increases a control voltage $V_{DLY}$ with which a capacitor 123C is charged. As described later, when the control voltage $V_{DLY}$ is increased, the delay amount of the delay line 110 is reduced.

On the other hand, when the phase of the divided clock signal CKos is ahead of that of the divided clock signal GCKs (that is, the delay amount of the delay line 110 is too small), the phase determining circuit 122 activates the down signal DNT to a high level. At that time, the up signal UPB is inactivated to a high level. This turns on an N-channel MOS transistor 123N included in the control-voltage generating circuit 123, which reduces the control voltage $V_{DLY}$ with which the capacitor 123C is charged. As described later, when the control voltage $V_{DLY}$ is reduced, the delay amount of the delay line 110 is increased.

With this feedback control, the delay amount of the delay line 110 is adjusted to delay the phase of the output clock signal Noden from that of the internal global clock signal IGCK exactly by k cycles.

A circuit diagram of the delay circuit UD1 is explained with reference to FIG. 7. The other delay circuits UD2 to UDn also have the same circuit configuration as that of the delay circuit UD1 shown in FIG. 7.

Figure 7:
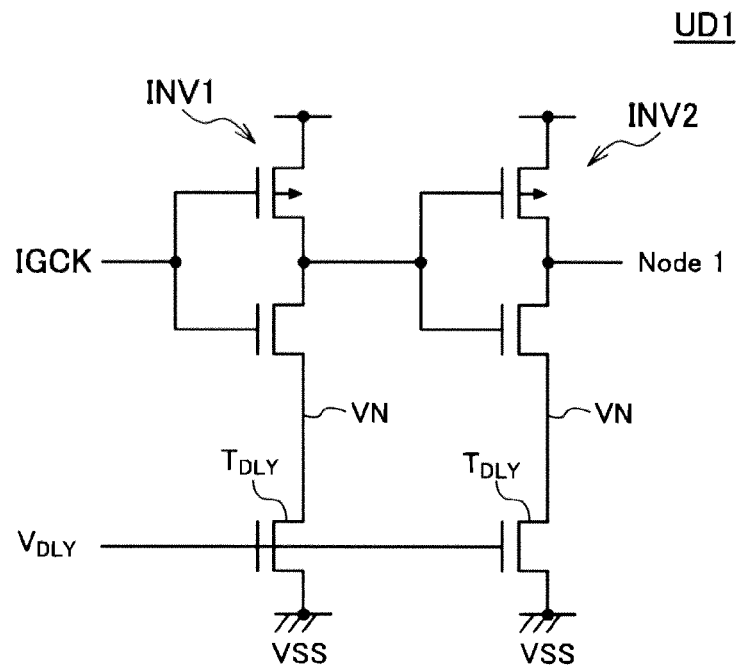
FIG. 7 is a circuit diagram of the delay circuit UD1 shown in FIG. 6.

As shown in FIG. 7, the delay circuit UD1 includes two stages of inverters INV1 and IVN2 series-connected. An adjusting transistor $T_{DLY}$ is inserted between a low-potential power-supply node VN of each of the inverters INV1 and INV2 and a ground potential VSS, and the control voltage $V_{DLY}$ is supplied to a gate electrode of each adjusting transistor $T_{DLY}$. Accordingly, switching speeds of the inverters INV1 and INV2 depends on the control voltage $V_{DLY}$. Specifically, when the control voltage $V_{DLY}$ is higher, the switching speeds of the inverters INV1 and INV2 are higher and thus a delay amount of the delay circuit UD1 becomes smaller. On the other hand, when the control voltage $V_{DLY}$ is lower, the switching speeds of the inverters INV1 and INV2 are lower and thus the delay amount of the delay circuit UD1 becomes larger.

Figure 8:
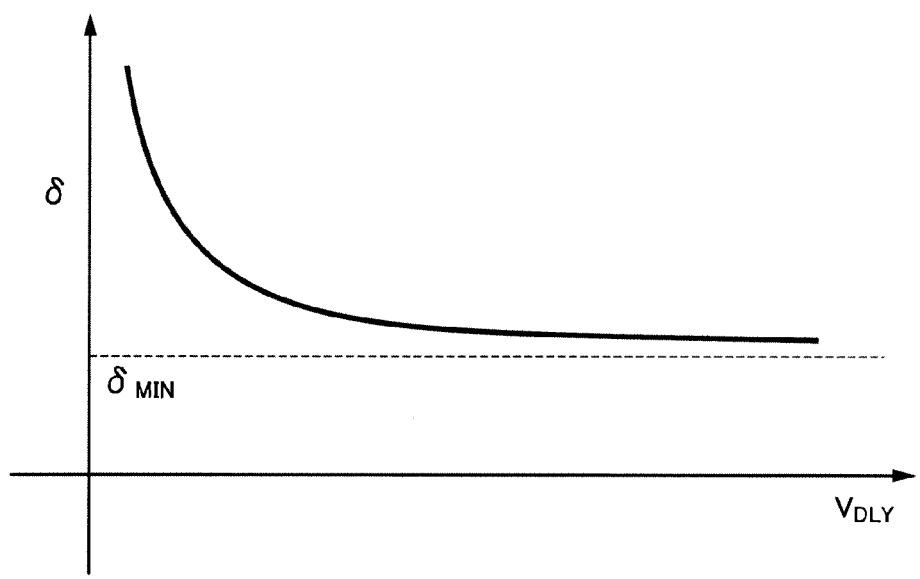
FIG. 8 is a graph showing a relation between the control voltage $V_{DLY}$ and the delay amount $\delta$ of the delay circuit UD1.

A relation between the control voltage $V_{DLY}$ and the delay amount $\delta$ of the delay circuit UD1 is shown in FIG. 8.

The delay amount $\delta$ shown in FIG. 8 is a time difference between the input clock signal (the internal global clock signal IGCK) and the output clock signal (Node1). As shown in FIG. 8, the delay amount $\delta$ is basically reduced when the control voltage $V_{DLY}$ is increased. However, the delay amount $\delta$ cannot be reduced infinitely and there is a minimum delay amount $\delta_{MIN}$. That is, however high the control voltage $V_{DLY}$ is, the delay amount of the delay circuit UD1 cannot be smaller than $\delta_{MIN}$. This means that a minimum value of a phase interval is $\delta_{MIN}$ when the output clock signals Node1 to Noden are arranged in this order. Therefore, when k=1, a minimum value of a phase interval of the multi-phase clock signal DTCK1 is also restricted to $\delta_{MIN}$. However, because k is an integer equal to or larger than 2 and is set to a different value from the number n of stages of the delay circuits that constitute the delay line 110 in the present embodiment, the phase interval of the multi-phase clock signal DTCK1 can be set to smaller than $\delta_{MIN}$. Details thereof will be explained later.

Figure 9:
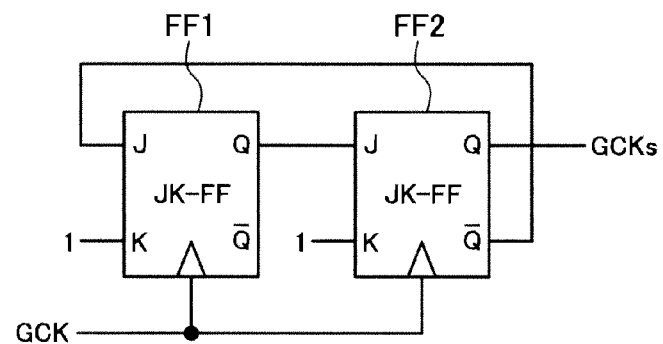
FIG. 9 is a circuit diagram showing a part of the frequency dividing circuit 121 shown in FIG. 6.

A circuit shown in FIG. 9 is a circuit part that generates the divided clock signal GCKs from the internal global clock signal IGCK, and a circuit diagram of an example in which k=3 is shown. The example shown in FIG. 9 has a configuration in which JK flip-flop circuits FF1 and FF2 are circularly connected. The internal global clock signal IGCK is supplied to each clock node of the flip-flop circuits FF1 and FF2. This causes a rising edge of the divided clock signal GCKs to be generated once each time a rising edge of the internal global clock signal IGCK is input three times.

Figure 10:
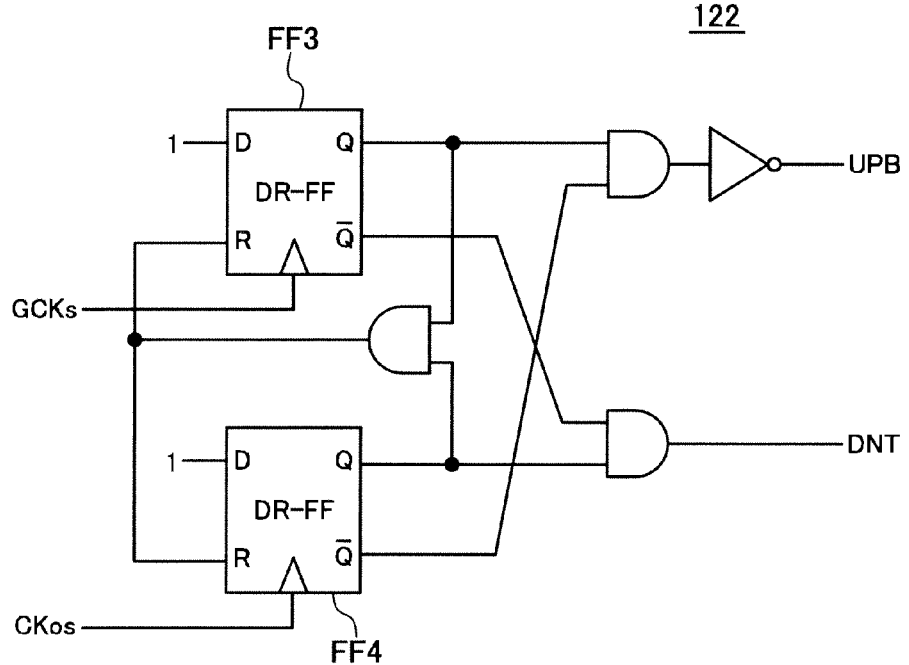
FIG. 10 is a circuit diagram of the phase determining circuit 122 shown in FIG. 6.

The phase determining circuit 122 shown in FIG. 10 includes data-latch flip-flop circuits FF3 and FF4. The divided clock signal GCKs is input to a clock node of the flip-flop circuit FF3 and the divided clock signal CKos is input to a clock node of the flip-flop circuit FF4. The up signal UPB is activated to a low level when the flip-flop circuits FF3 and FF4 are in a set state and in a reset state, respectively, and the down signal DNT is activated to a high level when the flip-flop circuits FF3 and FF4 are in a reset state and in a set state, respectively. This enables one of the up signal UPB and the down signal DNT to be activated according to which one of the rising edges of the divided clock signals GCKs and CKos precedes the other. When both of the flip-flop circuits FF3 and FF4 are set, the flip-flop circuits FF3 and FF4 are reset.

The circuit configuration of the clock generating circuit 100 is as explained above. The other clock generating circuits 101 and 102 have the same circuit configuration as that of the clock generating circuit 100. An operation of the clock generating circuit 100 is explained using a case where n=5 and k=3 as an example. As mentioned above, n is the number of the delay circuits UD1 to UDn included in the delay line 110 and k is a division number of the frequency dividing circuit 121. While this point is explained later, it is preferable that a value of n and a value of k are both integers equal to or larger than 2 and that the greatest common divisor thereof is 1. The example in which n=5 and k=3 explained below satisfies this condition.

Figure 11:
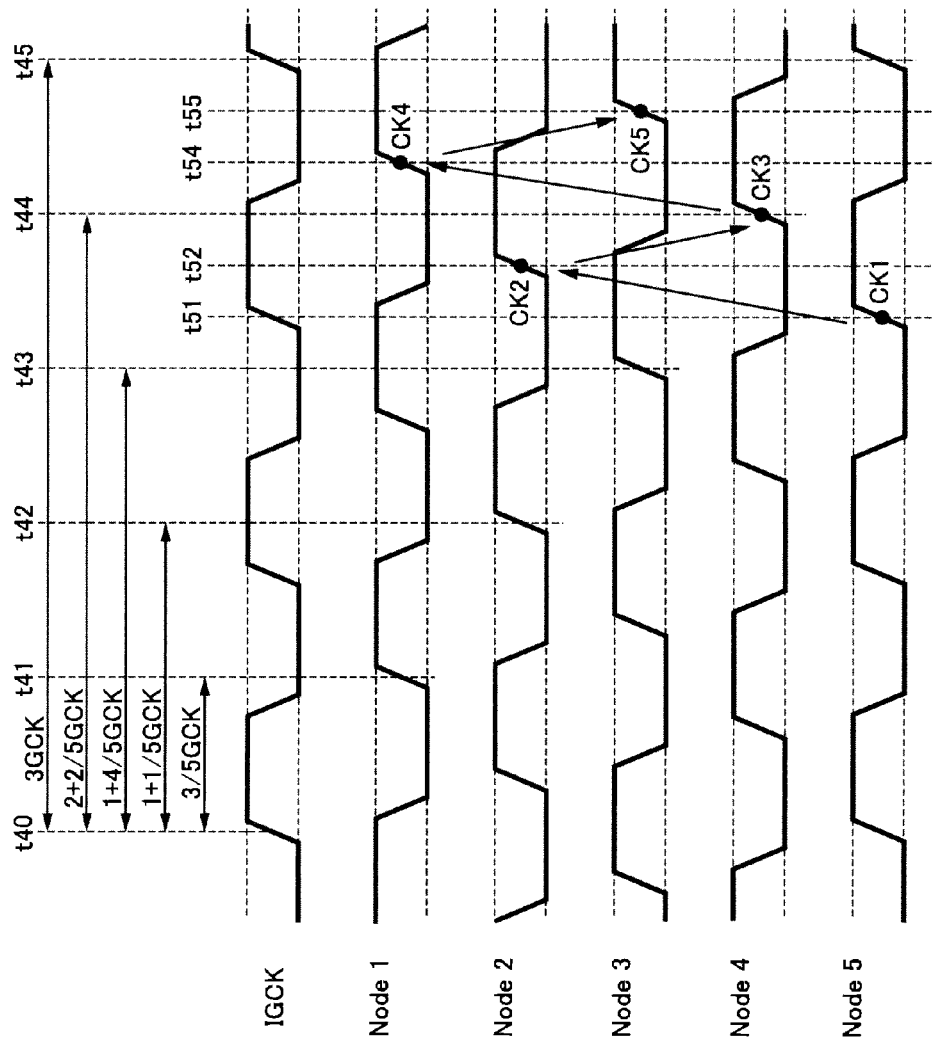
FIG. 11 is a timing chart for explaining an operation of the clock generating circuit 100 and represents the example in which n=5 and k=3.

Because n=5 in the example shown in FIG. 11, the output clock signal Node5 output from the delay circuit UD5 at the last stage is delayed exactly by three cycles from the internal global clock signal IGCK input to the delay circuit UD1 at the first stage. Because five stages of delay circuits UD1 to UD5 have been passed to generate the delay of three cycles, a phase interval becomes 3GCK/5 when the output clock signals Node1 to Node5 are arranged in this order. In this case, "GCK" indicates one cycle of the internal global clock signal IGCK.

Specifically, a rising edge of the internal global clock signal IGCK at a time t40 is delayed by 3GCK/5 by the delay circuit UD1 and accordingly a rising edge of the output clock signal Node1 appears at a time t41, which is a time delayed by 3GCK/5 from the time t40. The rising edge of the output clock signal Node1 at the time t41 is delayed by another 3GCK/5 by the delay circuit UD2 and accordingly a rising edge of the output clock signal Node2 appears at a time t42, which is a time delayed by 6GCK/5 from the time t40. The rising edge of the output clock signal Node2 at the time t42 is delayed by another 3GCK/5 by the delay circuit UD3 and accordingly a rising edge of the output clock signal Node3 appears at a time t43, which is delayed by 9GCK/5 from the time t40. The rising edge of the output clock signal Node3 at the time t43 is delayed by another 3GCK/5 by the delay circuit UD4 and accordingly a rising edge of the output clock signal Node4 appears at a time t44, which is a time delayed by 12GCK/5 from the time t40. The rising edge of the output clock signal Node4 at the time t44 is delayed by another 3GCK/5 by the delay circuit UD5 and accordingly a rising edge of the output clock signal Node5 appears at a time t45, which is a time delayed by 3GCK from the time t40.

To focus attention on the last one cycle of the internal global clock signal IGCK (from a time t51 to the time t45) in FIG. 11, it can be seen that the rising edges of the output clock signals Node1 to Node5 all appear during this period. Specifically, the rising edge of the output clock signal Node5 appears at the time t51, the rising edge of the output clock signal Node2 appears at a time t52, which is a time delayed by GCK/5 from the time t51, the rising edge of the output clock signal Node4 appears at the time t44, which is a time delayed by GCK/5 from the time t52, the rising edge of the output clock signal Node1 appears at a time t54, which is a time delayed by GCK/5 from the time t44, and the rising edge of the output clock signal Node3 appears at a time t55, which is a time delayed by GCK/5 from the time t54.

Therefore, when the output clock signals Node1 to Node5 are rearranged in the order mentioned above, the phase interval is reduced to GCK/5. This means that even when the minimum delay amount $\delta_{MIN}$ is k×GCK/n (3GCK/5), a smaller phase interval (GCK/5) can be obtained. Rearrangement of the output clock signals Node1 to Node 5 is performed by the routing circuit 130.

Figure 12:
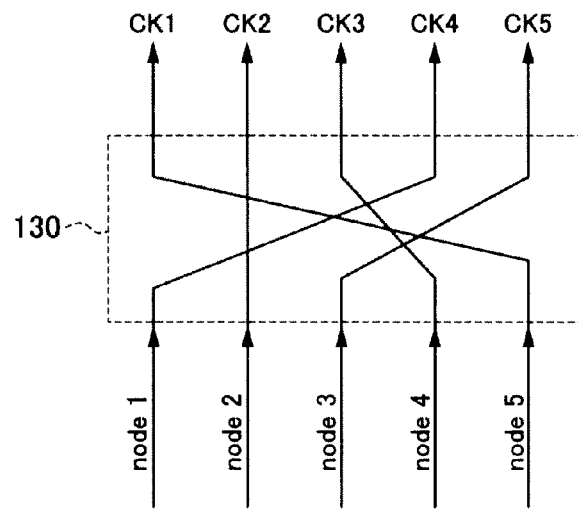
FIG. 12 is a wiring diagram for explaining a function of the routing circuit 130 shown in FIG. 6.

In the wiring diagram shown in FIG. 12, the output clock signals Node1 to Node5 are allocated to the multi-phase clock signals CK4, CK2, CK5, CK3, and CK1, respectively. Such routing can be realized by using fixed wiring. In such a case, the routing circuit 130 can be configured by simple wiring.

However, to cause the values of n and k to be variable, it is necessary that the routing circuit 130 can change allocation without being configured by fixed wiring.

Figure 13:
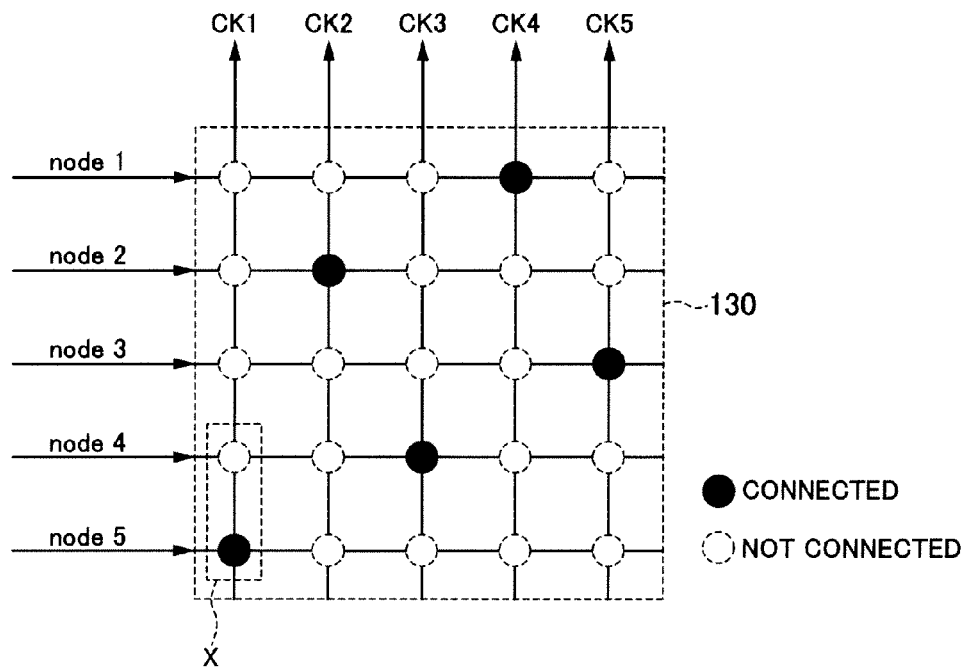
FIG. 13 is a schematic diagram for explaining a function of the routing circuit 130 that can change allocation.

Turning to FIG. 13, lines of the output clock signals Node1 to Node5 extend in a lateral direction and lines of the phase-clock signals CK1 to CK5 extend in a longitudinal direction. Intersections shown by black circles indicate that a lateral line and a longitudinal line are connected with each other and intersections shown by white circles indicate that a lateral line and a longitudinal line are not connected with each other. Also in an example shown in FIG. 13, the output clock signals Node1 to Node5 are allocated to the multi-phase clock signals CK4, CK2, CK5, CK3, and CK1, respectively, and the same result as the routing circuit 130 shown in FIG. 12 is obtained. However, this is different from the routing circuit 130 shown in FIG. 12 in that as which of the multi-phase clock signals CK1 to CK5 each of the output clock signals Node1 to Node5 is used can be changed.

Figure 14:
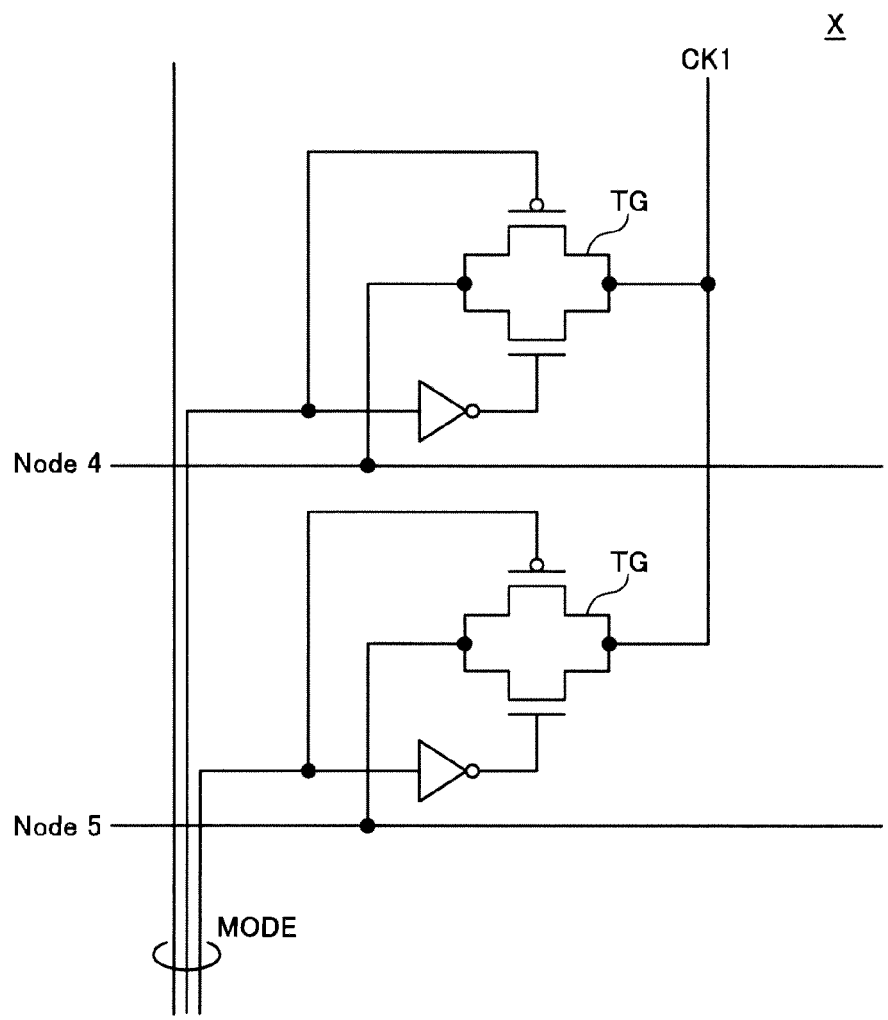
FIG. 14 is a circuit diagram of an area X shown in FIG. 13.

In an example shown in FIG. 14 that shows a circuit diagram of an area X shown in FIG. 13, a transfer gate TG is provided at each intersection. Accordingly, it is possible to switch whether a lateral line and a longitudinal line are connected with each other. Switching of the transfer gate TG can be performed by a mode signal MODE supplied from the mode register 14. With this configuration, each of the output clock signals Node1 to Node5 can be allocated to any of the multi-phase clock signals CK1 to CK5.

Figure 15:
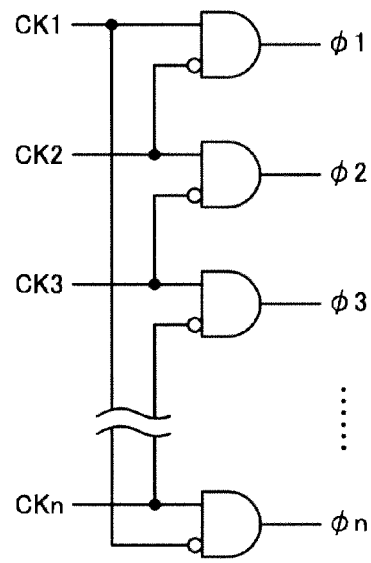
FIG. 15 is a circuit diagram of the shaping circuit 140 shown in FIG. 6.

A circuit diagram of the shaping circuit 140 is shown in FIG. 15. An operation waveform diagram of the shaping circuit 140 is shown in FIG. 16.

Figure 16:
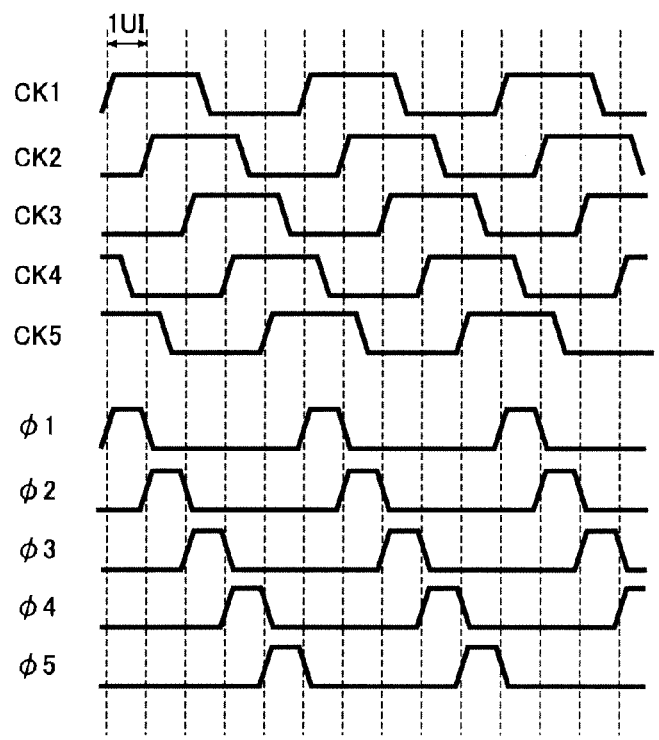
FIG. 16 is an operation waveform diagram of the shaping circuit 140.

As shown in FIG. 16, the multi-phase clock signals CK1 to CK5 have the same duty as that of the internal global clock signal IGCK and thus high-level periods overlap with each other when these signals are used as they are. The shaping circuit 140 shown in FIG. 15 prevents two multi-phase clock signals with adjacent phases among the multi-phase clock signals CK1 to CK5 from having a high level at the same time. Accordingly, each of the multi-phase clock signals φ1 to φ5 rises with a rising edge of the corresponding one of the multi-phase clock signals CK1 to CK5 and falls with a rising edge of a subsequent multi-phase clock signal. As a result, the multi-phase clock signals φ1 to φ5 have waveforms from which the period in which the signals have a high level has been eliminated, as shown in FIG. 16.

The multi-phase clock signal DTCK1 generated in this way is supplied to the multiplexers MUX0 to MUXp shown in FIG. 5 and is used as a timing signal therefor. While attention has been focused on the clock generating circuit 100 in the above explanations, circuit configurations and operations of the other clock generating circuits 101 and 102 are the same as those of the clock generating circuit 100.

In the present embodiment, the internal global clock signal IGCK used as a base is delayed by k cycles by the n delay circuits UD1 to UDn and thus the multi-phase clock signals having a smaller phase interval than the minimum delay amount $\delta_{MIN}$ of one delay circuit can be generated by the simple circuit configuration. More specifically, when the greatest common divisor of n and k is GCM, one cycle of the internal global clock signal IGCK is GCK, and a phase interval of the multi-phase clock signals is UI, a length of the phase interval UI is defined as UI=GCK×GCM/n.

Accordingly, the multiplexers and the demultiplexers can sequentially receive the data signal in every GCM/n cycle of the internal global clock signal IGCK. This means that the data signal of n bits can be received in one cycle of the internal global clock signal IGCK. Because GCM=1 and n=5 in the embodiment mentioned above, the following expression holds:

UI=GCK/5.

Accordingly, the multiplexers and the demultiplexers can sequentially receive the data signal in every ⅕ cycle of the internal global clock signal IGCK and thus the data signal of 5 bits can be received in one cycle of the internal global clock signal IGCK.

While it suffices to increase the value of n to reduce the phase interval UI, the phase interval UI increases when the greatest common divisor GCM of n and k is equal to or larger than 2, and it is preferable that the greatest common divisor GCM is 1. This is because some phases of the n output clock signals Node1 to Noden output from the delay circuits UD1 to UDn, respectively, overlap with each other when the greatest common divisor GCM is equal to or larger than 2. On the contrary, when the greatest common divisor GCM is 1, the n output clock signals Node1 to Noden output from the delay circuits UD1 to UDn have different phases, respectively.

An arbitrary combination of n and k having the greatest common divisor of 1 can be used. Both can be odd numbers as in the above example (n=5 and k=3) or one of them can be an even number as n=34 and k=3.

As already explained with reference to FIG. 11, the delay amount k×GCK/n of each of the delay circuits UD1 to UDn needs to be equal to or larger than the minimum value $\delta_{MIN}$ of the delay amount. That is, the following expression needs to hold:

$\delta_{MIN} \leq k \times GCK/n$.

Therefore, when the value of n is increased to reduce the phase interval UI, the value of k needs to be set to satisfy this expression.

Although a relation in magnitude between n and k is not particularly limited, it is preferable that n>k. The value of k is independent of the phase interval UI as long as the greatest common divisor GCM is 1; however, when the value of k is increased, an entire delay amount of the delay line 110 is increased and accordingly the delay amount of each of the delay circuits UD1 to UDn needs to be increased. In this case, blunting of waveforms by the delay circuits UD1 to UDn may increase and clock accuracy may be reduced. In consideration thereof, the value of k is preferably set as small as possible within a range that satisfies the following expression:

$\delta_{MIN} \leq k \times GCK/n$.

It is apparent that the present invention is not limited to the above embodiments, but may be modified and changed without departing from the scope and spirit of the invention.

For example, it is not essential to use all of the generated multi-phase clock signals φ1 to φn in the multiplexers or the demultiplexers and some of these can be used. For example, even when the multi-phase clock signals φ1 to φ5 are five-phase clock signals as in the embodiment mentioned above, only four multi-phase clock signals φ1 to φ4 among them can be supplied to the multiplexers or the demultiplexers.

While the three types of multi-phase clock signals (DTCK1, DRCK1, and ARCK1, for example) are generated by separate clock generating circuits, respectively, in the embodiment mentioned above, an output from one clock generating circuit can be commonly used as these multi-phase clock signals. Because this reduces an occupation area of the clock generating circuits on a chip, it is suitable when phases of the multi-phase clock signals do not need to be finely adjusted.

What is claimed is:

1. A semiconductor device comprising:
   $1^{st}$ to $n^{th}$ delay circuits cascade-connected in this order, the $1^{st}$ to $n^{th}$ delay circuits outputting $1^{st}$ to $n^{th}$ output clock signals, respectively, based on an input clock signal supplied to the $1^{st}$ delay circuit;
   a control circuit controlling a delay amount of each of the $1^{st}$ to $n^{th}$ delay circuits such that the $1^{st}$ to $n^{th}$ output clock signals have different phases from one another; and
   a data processing circuit processing a plurality of data signals synchronously with $1^{st}$ to $n^{th}$ output clock signals, respectively.

2. The semiconductor device as claimed in claim 1, wherein a sum of the delay amounts of the $1^{st}$ to $n^{th}$ delay circuits is substantially the same as k clock cycles of the input clock signal, where k is an integer more than 1 and is different from n.

3. The semiconductor device as claimed in claim 2, wherein a greatest common divisor of the n and the k is 1.

4. The semiconductor device as claimed in claim 3, wherein the n is larger than the k.

5. The semiconductor device as claimed in claim 1, wherein
   the data processing circuit includes a plurality of input nodes and an output node,
   each of the data signals is supplied to an associated one of the input nodes, and
   the data processing circuit serially outputs the data signals to the output node synchronously with the $1^{st}$ to $n^{th}$ output clock signals.

6. The semiconductor device as claimed in claim 1, wherein
   the data processing circuit includes an input node and a plurality of output nodes,
   the data signals are supplied in serial to the input node, and
   the data processing circuit outputs each of the data signals to an associated one of the output nodes synchronously with the $1^{st}$ to $n^{th}$ output clock signals.

7. The semiconductor device as claimed in claim 2, wherein
   the data signals are n-bit data, and
   when a greatest common divisor of the n and the k is GCM, the data processing circuit sequentially processing the n-hit data at each timing of a GCM/n cycle of the input clock signal.

8. A semiconductor device comprising:
   a clock generating circuit including a plurality of delay circuits which are connected such that an output node of a preceding one of the delay circuits is connected to an input node of a succeeding one of the delay circuits and an input node of a leading one of the delay circuits being configured to receive an internal clock signal, the delay circuits being configured to respectively output delayed clock signals to the output nodes thereof, and the delayed clock signals outputted from the delay circuits being different in phase from one another; and
   a data input/output circuit including a plurality of input nodes each supplied with corresponding data, an output node, and a plurality of switching circuits each provided between the output node and a corresponding one of the input nodes, each of the switching circuits being configured to transfer the corresponding data to the output node in response to a corresponding one of the delayed clock signals.

9. The semiconductor device as claimed in claim 8, further comprising an external data terminal coupled to the data input/output circuit.

10. The semiconductor device as claimed in claim 8, further comprising:
   an additional data input/output circuit including a plurality of additional input nodes each supplied with additional corresponding data, an additional output node, and a plurality of additional switching circuits each provided between the additional output node and a corresponding one of the additional input nodes, each of the additional switching circuits being configured to transfer the additional corresponding data to the additional output node in response to the corresponding one of the delayed clock signals.

11. The semiconductor device as claimed in claim 10, further comprising an additional external data terminal coupled to the additional data input/output circuit.

12. The semiconductor device as claimed in claim 8, wherein the clock generating circuit further includes a delay control circuit configured to receive the internal clock signal and the delayed clock signal outputted from the output node of a lattermost one of the delay circuits, the delay control circuit being configured to adjust a delay amount of each of the delay circuits such that the internal clock signal and the delayed clock signal outputted from the output node of the lattermost one of the delay circuits are equal in phase to each other.

13. The semiconductor device as claimed in claim 8, wherein the clock generating circuit further includes a shaping circuit configured to change a duty ratio of each of the delayed clock signals such that ones of high and low time periods of the delayed clock signal are not substantially overlapped with one another.

14. The semiconductor device as claimed in claim 12, wherein the delay amount of each of the delay circuits is adjusted to take an equal value.

15. A semiconductor device comprising:
   a delay line that includes n delay circuits cascade-connected and delays an input clock signal by k cycles; and
   a routing circuit that generates multi-phase clock signals having different phases based on at least a part of n output clock signals output from the n delay circuits, respectively,
   wherein the n and the k are both integers more than 1 and a greatest common divisor thereof is 1.

16. The semiconductor device as claimed in claim 15, wherein the n is larger than the k.

17. The semiconductor device as claimed in claim 15, wherein a phase interval of the multi-phase clock signals is smaller than a minimum delay time of each of the delay circuits.

18. The semiconductor device as claimed in claim 15, further comprising:
   a frequency dividing circuit that divides the input clock signal and an output clock signal output from the delay line by k to generate first and second divided clock signals, respectively; and
   a control circuit that controls a delay amount of each of the n delay circuits based on phases of the first and second divided clock signals.

* * * * *